United States Patent
Iwamoto

(10) Patent No.: US 10,200,010 B2
(45) Date of Patent: Feb. 5, 2019

(54) ELASTIC WAVE FILTER DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 138 days.

(21) Appl. No.: 15/185,102

(22) Filed: Jun. 17, 2016

(65) Prior Publication Data

US 2016/0301386 A1 Oct. 13, 2016

Related U.S. Application Data

(63) Continuation of application No. PCT/JP2014/083825, filed on Dec. 22, 2014.

(30) Foreign Application Priority Data

Dec. 25, 2013 (JP) .................. 2013-267366

(51) Int. Cl.
*H03H 9/70* (2006.01)
*H03H 9/72* (2006.01)
(Continued)

(52) U.S. Cl.
CPC ........ *H03H 9/0566* (2013.01); *H03H 9/0547* (2013.01); *H03H 9/0576* (2013.01);
(Continued)

(58) Field of Classification Search
CPC ......... H03H 2009/0019; H03H 9/0547; H03H 9/0566; H03H 9/0576; H03H 9/1092;
(Continued)

(56) References Cited

U.S. PATENT DOCUMENTS

2004/0238954 A1* 12/2004 Miyaji .................. H01L 24/10
257/737
2007/0080757 A1 4/2007 Yahata et al.
(Continued)

FOREIGN PATENT DOCUMENTS

JP 2006-186747 A 7/2006
JP 2007-67617 A 3/2007
(Continued)

OTHER PUBLICATIONS

Official Communication issued in International Application PCT/JP2014/083825, dated Apr. 7, 2015.

*Primary Examiner* — Barbara Summons
(74) *Attorney, Agent, or Firm* — Keating & Bennett, LLP

(57) ABSTRACT

An elastic wave filter device includes a transmission filter chip, a reception filter chip, and a mounting terminal. The transmission filter chip includes a piezoelectric substrate and an IDT electrode provided on a principal surface of the piezoelectric substrate. The reception filter chip includes a piezoelectric substrate and an IDT electrode provided on a principal surface of the piezoelectric substrate. The transmission filter chip and the reception filter chip are laminated to provide sealed spaces above the IDT electrodes. The mounting terminal is disposed on a side of the reception filter chip opposite to the transmission filter chip side. The elastic wave filter device is mounted such that the reception filter chip faces a mounting surface.

16 Claims, 11 Drawing Sheets

(51) Int. Cl.
   *H03H 9/54* (2006.01)
   *H03H 9/64* (2006.01)
   *H03H 9/05* (2006.01)

(52) U.S. Cl.
   CPC .............. *H03H 9/54* (2013.01); *H03H 9/64* (2013.01); *H03H 9/706* (2013.01); *H03H 9/725* (2013.01)

(58) Field of Classification Search
   CPC .......... H03H 9/54; H03H 9/64; H03H 9/6489; H03H 9/706; H03H 9/725
   USPC ........................................................ 333/133
   See application file for complete search history.

(56) References Cited

U.S. PATENT DOCUMENTS

| | | | | |
|---|---|---|---|---|
| 2007/0115079 | A1* | 5/2007 | Kubo | B81C 1/00238 333/189 |
| 2007/0170565 | A1 | 7/2007 | Hong et al. | |
| 2009/0224851 | A1* | 9/2009 | Feiertag | H03H 9/059 333/186 |
| 2011/0146041 | A1* | 6/2011 | Miyake | H03H 3/02 29/25.35 |
| 2012/0306593 | A1* | 12/2012 | Kidoh | H03H 9/1064 333/186 |
| 2013/0002371 | A1* | 1/2013 | Ono | H01P 1/2135 333/126 |
| 2013/0163212 | A1 | 6/2013 | Tanaka et al. | |
| 2014/0354374 | A1 | 12/2014 | Kawachi et al. | |

FOREIGN PATENT DOCUMENTS

| | | |
|---|---|---|
| JP | 2007-110202 A | 4/2007 |
| JP | 2007-134795 A | 5/2007 |
| JP | 2007-202130 A | 8/2007 |
| JP | 2010-219876 A | 9/2010 |
| JP | 2013-132015 A | 7/2013 |
| WO | 2013128541 A1 | 9/2013 |

* cited by examiner

ELASTIC WAVE FILTER DEVICE

CROSS REFERENCE TO RELATED APPLICATIONS

This application claims the benefit of priority to Japanese Patent Application 2013-267366 filed Dec. 25, 2013 and is a Continuation Application of PCT/JP2014/083825 filed on Dec. 22, 2014. The entire content of each application are hereby incorporated by reference.

BACKGROUND OF THE INVENTION

1. Field of the Invention

The present invention relates to elastic wave filter devices used in transmission and reception.

2. Description of the Related Art

As a conventional elastic wave filter device, a duplexer disclosed in Japanese Unexamined Patent Application Publication No. 2007-67617 can be cited, for example. This duplexer includes a transmission piezoelectric filter formed on a first substrate and a reception piezoelectric filter formed on a second substrate. The first substrate and the second substrate are disposed such that the transmission piezoelectric filter and the reception piezoelectric filter oppose each other. An interspace between the first substrate and the second substrate is air-tightly sealed with an outer periphery pad. The duplexer is mounted on a mother substrate while setting the transmission piezoelectric filter side to be a lower surface of the duplexer, thereby improving heat dissipation effects.

In general, reception filters are required to have high-level attenuation characteristics, particularly at transmission wave bands, in order to suppress wraparound action of the transmission waves. As for the duplexer disclosed in Japanese Unexamined Patent Application Publication No. 2007-67617, it is mounted on the mother substrate such that the reception piezoelectric filter is disposed on a side being distanced from the mother substrate. Because of this, a wiring length between the reception piezoelectric filter and a ground line of the mother substrate becomes long. As a result, a stray inductance is generated between the reception piezoelectric filter and the ground line, wiring resistance increases, and so on. This consequently degrades attenuation characteristics of the reception filter.

SUMMARY OF THE INVENTION

Preferred embodiments of the present invention provide an elastic wave filter device capable of realizing a preferable isolation characteristic by sufficiently removing signals in a periphery of a pass frequency band of a reception signal.

An elastic wave filter device according to a preferred embodiment of the present invention includes a transmission filter chip, a reception filter chip, and a mounting terminal. The transmission filter chip includes a first piezoelectric substrate and a first functional electrode provided on a principal surface of the first piezoelectric substrate. The reception filter chip includes a second piezoelectric substrate and a second functional electrode provided on a principal surface of the second piezoelectric substrate. The transmission filter chip and the reception filter chip are laminated such that a space is secured above the first functional electrode as well as above the second functional electrode. The mounting terminal is disposed on a side of the reception filter chip opposite to the transmission filter chip side. The elastic wave filter device according to a preferred embodiment of the present invention is mounted such that the reception filter chip side faces a mounting surface.

With this structure, the wiring length between the reception filter chip and the ground line becomes short. This makes it possible to significantly reduce a stray inductance generated between the reception filter chip and the ground line, wiring resistance, and the like. As such, signals in the periphery of a pass frequency band of a reception signal are sufficiently removed and a signal level in the periphery of the reception frequency band is lowered. Because of this, a preferable isolation characteristic is realized.

It is preferable for an area of the reception filter chip to be smaller than an area of the transmission filter chip when viewed in a lamination direction.

With this structure, a material amount of the piezoelectric substrate used in the reception filter chip is significantly reduced while ensuring electric power handling capability of the transmission filter chip.

It is preferable that an elastic wave filter device according to a preferred embodiment of the present invention include an extended interconnection as follows. That is, the extended interconnection is wired in an outer side portion of the reception filter chip, is also wired in an inner side portion of the transmission filter chip when viewed in the lamination direction, and is connected to the first functional electrode.

With this structure, the elastic wave filter device is significantly reduced in size or miniaturized.

It is preferable that, of the principal surfaces of the second piezoelectric substrate, the principal surface on which the second functional electrode is disposed faces the mounting terminal side.

With this structure, the wiring length between the reception filter chip and the ground line becomes even shorter. This makes it possible to realize a more preferable isolation characteristic.

It is preferable for an elastic wave filter device according to a preferred embodiment of the present invention to include a structure such that the elastic wave filter device further includes a cover layer and an adhesive film. The cover layer covers the first functional electrode so as to secure a space above the first functional electrode. The adhesive film is pasted to, of principal surfaces of the cover layer, a principal surface on a side opposite to the first functional electrode side, and fixes the reception filter chip. Heat dissipation performance of the adhesive film is higher than that of the cover layer.

With this structure, since the heat generated in the transmission filter chip is dissipated from the adhesive film, heat dissipation performance of the transmission filter chip is significantly increased.

It is preferable for an elastic wave filter device according to the present invention to include a transmission filter chip that includes a transmission filter corresponding to a plurality of transmission bands. A reception filter chip includes a reception filter corresponding to a plurality of reception bands.

With this structure, a degree of integration of the elastic filter device is significantly increased. In addition, since a difference in dimension between the transmission filter chip and the reception filter chip becomes large, a space for the extended interconnection being wired is thus made large. This makes it possible to increase a degree of freedom in layout of the extended interconnection such that a filter characteristic of the elastic wave filter device is improved.

According to various preferred embodiments of the present invention, by sufficiently removing signals in the periphery of a pass frequency band of a transmission signal, a preferable isolation characteristic is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
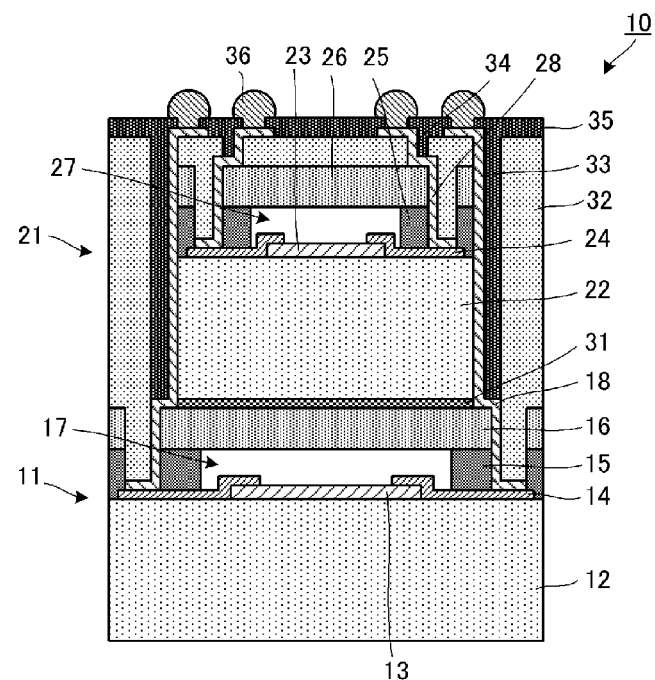
FIG. 1 is a cross-sectional view of an elastic wave filter device according to a first preferred embodiment of the present invention.

An elastic wave filter device 10 according to a first preferred embodiment of the present invention will be described. The elastic wave filter device 10 is preferably used as a duplexer, for example. FIG. 1 is a cross-sectional view of the elastic wave filter device 10. The elastic wave filter device 10 includes a transmission filter chip (transmission elastic wave element) 11 and a reception filter chip (reception elastic wave element) 21.

The transmission filter chip 11 includes a piezoelectric substrate 12, an interdigital transducer (IDT) electrode 13 as a functional electrode, a wiring layer 14, a support layer 15, a cover layer 16, and an extended interconnection (signal acquisition interconnection) 18. The piezoelectric substrate 12 corresponds to a first piezoelectric substrate of a preferred embodiment of the present invention. The IDT electrode 13 corresponds to a first functional electrode of a preferred embodiment of the present invention.

The IDT electrode 13, the wiring layer 14, the support layer 15, and the cover layer 16 are laminated on an upper surface of the piezoelectric substrate 12 in that order. The wiring layer 14 is connected to the IDT electrode 13. A protective insulation film (not shown) made of a material such as $SiO_2$ or the like is provided on a surface (upper surface) of the IDT electrode 13 and the wiring layer 14 so that a portion which makes contact with the extended interconnection 18 is exposed. The support layer 15 preferably surrounds the IDT electrode 13. The cover layer 16 preferably covers an upper portion of the IDT electrode 13. With this, a sealed space 17 is provided above the IDT electrode 13. A via is provided in the support layer 15 and the cover layer 16, and the extended interconnection 18 is provided in the via. The extended interconnection 18 extends up to an upper surface of the cover layer 16. The extended interconnection 18 is connected to the wiring layer 14.

The reception filter chip 21 includes a piezoelectric substrate 22, an IDT electrode 23, a wiring layer 24, a support layer 25, a cover layer 26, and an extended interconnection 28. The piezoelectric substrate 22 corresponds to a second piezoelectric substrate of a preferred embodiment of the present invention. The IDT electrode 23 corresponds to a second functional electrode of a preferred embodiment of the present invention.

The IDT electrode 23, the wiring layer 24, the support layer 25, and the cover layer 26 are laminated on an upper surface of the piezoelectric substrate 22 in that order. The wiring layer 24 is connected to the IDT electrode 23. A protective insulation film (not shown) made of a material such as $SiO_2$ or the like is provided on a surface of the IDT electrode 23 and the wiring layer so that a portion which makes contact with the extended interconnection 28 is exposed. The support layer 25 preferably surrounds the IDT electrode 23. The cover layer 26 preferably covers an upper portion of the IDT electrode 23. With this, a sealed space 27 is provided above the IDT electrode 23. A via is provided in the support layer 25 and the cover layer 26, and the extended interconnection 28 is provided in the via. The extended interconnection 28 extends up to an upper surface of the cover layer 26. The extended interconnection 28 is connected to the wiring layer 24. An area of a principal surface (upper surface) of the piezoelectric substrate 22 in the reception filter chip 21 is smaller than an area of a principal surface of the piezoelectric substrate 12 in the transmission filter chip 11.

Although the support layer 15 and the cover layer 16 preferably are separately formed, they may be integrally formed, for example. The same can be applied to the support layer 25 and the cover layer 26.

The reception filter chip 21 is fixed to the upper surface of the cover layer 15 preferably with an adhesive film 31 therebetween, for example. Heat dissipation performance of the adhesive film 31 is higher than that of the cover layer 16 of the transmission filter chip 11. With this, since the heat generated in the transmission filter chip 11 is dissipated from the adhesive film 31, the heat dissipation performance of the transmission filter chip 11 is significantly increased. Note that it is preferable for the extended interconnection 18 of the transmission filter chip 11 to be in contact with the adhesive film 31. This causes the heat generated in the transmission filter chip 11 to be efficiently transmitted to the adhesive film 31, such that the heat dissipation performance of the transmission filter chip 11 is even more improved.

A resin layer 32 preferably covers the transmission filter chip 11 and an upper surface of the reception filter chip 21. The resin layer 32 is provided in order to secure locations to disposed extended interconnections 33 and 34, ensure airtightness of the sealed spaces 17 and 27, and protect the transmission filter chip 11 and the reception filter chip 21. Vias are provided in the resin layer 32, and the extended interconnections 33 and 34 are provided in the vias. The extended interconnections 33 and 34 extend up to an upper surface of the resin layer 32. The extended interconnection 33 is connected to the extended interconnection 18 of the transmission filter chip 11, while the extended interconnection 34 is connected to the extended interconnection 28 of the reception filter chip 21. As such, the extended interconnections 18, 28, 33, and 34 are wired in an inner side portion of the transmission filter chip 11 when viewed in the lamination direction. The extended interconnections 18 and 33 connected to the IDT electrode 13 of the transmission filter chip 11 are wired so as to pass an outer side portion of the reception filter chip 21. The extended interconnections 18 and 33 correspond to an "extended interconnection" of a preferred embodiment of the present invention.

A protection resist 35 is provided on the upper surface of the resin layer 32 and in the vias so as to cover the extended interconnections 18, 28, 33, and 34. Cavities are provided in the protection resist 35 so as to expose a portion of the extended interconnections 33 and 34. Mounting terminals 36 preferably project from the cavities. The mounting terminals 36 are connected to the extended interconnections 33 and 34. As such, the mounting terminals 36 are disposed on a side of the reception filter chip 21 opposite to the transmission filter chip 11 side. The mounting terminal 36 includes a ground terminal connected to the ground.

The piezoelectric substrates 12 and 22 are made of a $LiTaO_3$ substrate or the like. The IDT electrodes 13 and 23 as well as the wiring layers 14 and 24 are each made of a metal material such as Al, Cu, Pt, Au, W, Ta, Mo, or an alloy containing these metals as major components; alternatively, they may have a laminated structure. The support layers 15 and 25, the cover layers 16 and 26, and the resin layer 32 are each made of a resin material such as polyimide or the like. The extended interconnections 18, 28, 33, and 34 are each made of a metal film such as an Au/Ni/Cu film or the like. The material of the mounting terminal 36 is solder.

Since the transmission power is larger than the reception power, the transmission filter chip is required to have a higher electric power handling capability than the reception filter chip. Accordingly, in order to disperse the electric power, a functional portion area of the transmission filter chip is needed to be larger than that of the reception filter chip. Here, within a principal surface of a piezoelectric substrate of a filter chip (elastic wave element), an area of a portion that functions as an elastic wave filter is called a functional portion area.

In the first preferred embodiment, as discussed above, the transmission filter chip 11 preferably is larger in dimension than the reception filter chip 21. This ensures the electric power handling capability of the transmission filter chip 11. At the same time, the material amount of the piezoelectric substrate used in the reception filter chip 21 is significantly reduced in comparison with a case where the reception filter chip 21 is made to be the same as the transmission filter chip 11 in terms of dimensions. To rephrase, a larger number of reception filter chips 21 is able to be provided on a single piezoelectric wafer.

As discussed above, the extended interconnections 18, 28, 33, and 34 are wired in an inner side portion of the transmission filter chip 11 when viewed in the lamination direction. With this, the elastic wave filter device 10 is able to be significantly reduced in size or miniaturized in comparison with a case where the extended interconnections 18, 28, 33, and 34 are wired in an outer side portion of the transmission filter chip 11 when viewed in the lamination direction.

Further, as discussed above, the extended interconnections 18 and 33 connected to the IDT electrode 13 of the transmission filter chip 11 are wired so as to pass the outer side portion of the reception filter chip 21. In other words, it is unnecessary to form a via in the reception filter chip 21 to wire the extended interconnections 18 and 33. Accordingly, as a material of the piezoelectric substrate 22 of the reception filter chip 21, a material of low processability which is difficult to form a via therein, a brittle material having a risk of causing a crack in a case of forming a via, or the like can be used.

It is preferable that the transmission filter chip 11 include a transmission filter corresponding to a plurality of transmission bands. It is preferable that the reception filter chip 21 include a reception filter corresponding to a plurality of reception bands. With this, a degree of integration of the elastic wave filter device 10 is increased. Further, since a difference in dimension between the transmission filter chip 11 and the reception filter chip 21 becomes larger, a space for the extended interconnections 18, 28, 33, and 34 being wired is larger as well. This makes it possible to increase a degree of freedom in layout of the extended interconnections 18, 28, 33, and 34, such that a filter characteristic of the elastic wave filter device 10 is improved.

Figure 2:
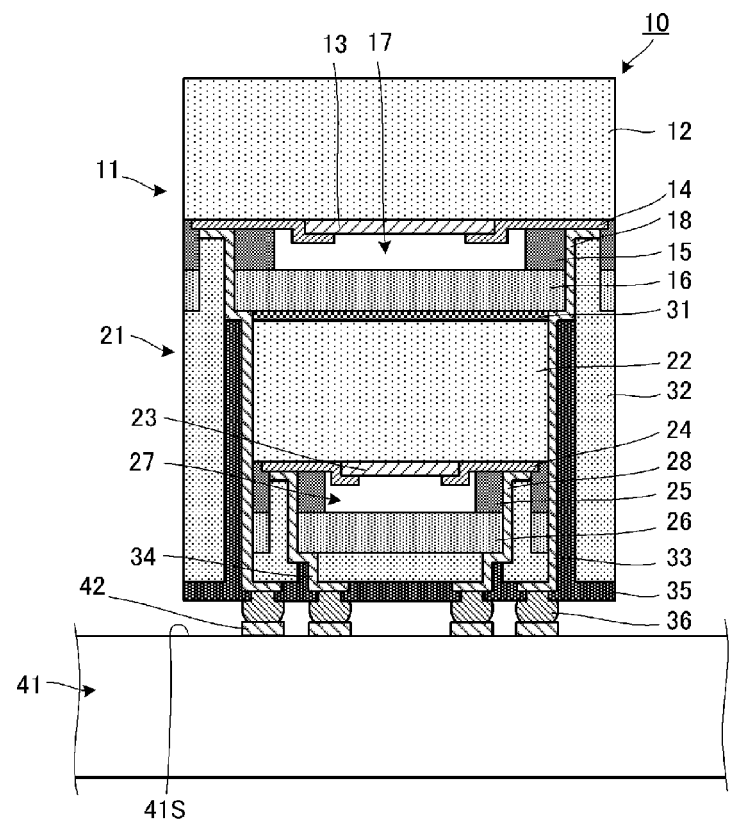
FIG. 2 is a cross-sectional view illustrating a mounting method of the elastic wave filter device according to the first preferred embodiment of the present invention.

FIG. 2 is a cross-sectional view illustrating a mounting method of the elastic wave filter device 10. The elastic wave filter device 10 is mounted such that the reception filter chip 21 side faces a mounting surface 41S of a module substrate 41. The mounting terminals 36 make contact with mounting pads 42 located on the mounting surface 41S of the module substrate 41 and are electrically connected thereto. The ground terminal included in the mounting terminal 36 is connected to a ground line through the mounting pad 42.

In the first preferred embodiment, as discussed above, the mounting terminals 36 are disposed on a side of the reception filter chip 21 opposite to the transmission filter chip 11 side. The mounting terminals 36 make contact with the mounting pads 42 located on the mounting surface 41S of the module substrate 41 and are electrically connected thereto. In other words, the elastic wave filter device 10 is mounted such that the reception filter chip 21 side faces the mounting surface 41S of the module substrate 41.

With the above-described configuration and mounting method, the wiring length between the reception filter chip 21 and the ground line of the module substrate 41 becomes short. This makes it possible to keep a stray inductance generated between the reception filter chip 21 and the ground line, wiring resistance, and the like being small. In other words, the reception filter chip 21 is made to be close to the ground. As a result, signals in the periphery of a pass frequency band of a reception signal are sufficiently removed (released) and a signal level in the periphery of the reception frequency band is able to be significantly lowered. Accordingly, a preferable isolation characteristic is able to be realized in the first preferred embodiment.

Further, as discussed above, of the principal surfaces of the reception filter chip 21, the principal surface where the IDT electrode 23 is provided (called an element surface) faces the mounting terminal 36 side. Because of this, the wiring length between the reception filter chip 21 and the ground line of the module substrate 41 becomes short in comparison with a case where the element surface of the reception filter chip 21 faces the transmission filter chip 11 side. As a result, in the first preferred embodiment, a preferable isolation characteristic is realized in comparison with the case where the element surface of the reception filter chip 21 faces the transmission filter chip 11 side.

The IDT electrode is used as a functional electrode in the present preferred embodiment, and a filter that makes use of surface acoustic waves, boundary acoustic waves, plate waves, or the like is preferably a component corresponding to the electrode. However, the functional electrode is not limited to the IDT electrode structure. Such an electrode structure that makes use of bulk waves also is able to be used if the electrode is a functional electrode to make use of vibrations of the piezoelectric substrate.

Figure 3A:
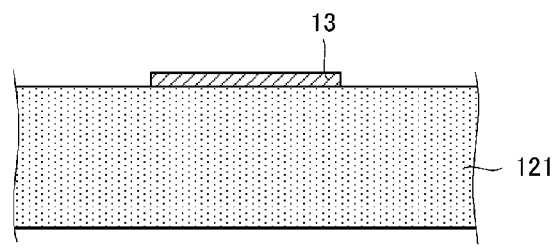
FIGS. 3A-3D are cross-sectional views illustrating a manufacturing method of the elastic wave filter device according to the first preferred embodiment of the present invention.
Figure 3B:
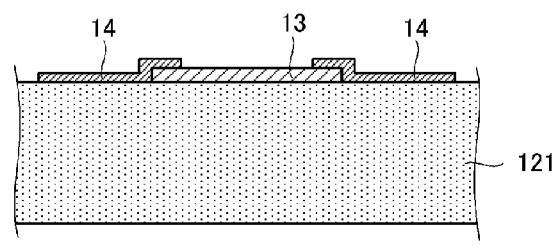

FIG. 3A through FIG. 8 are cross-sectional views illustrating a non-limiting example of a manufacturing method of the elastic wave filter device 10. First, as shown in FIG. 3A, the IDT electrode 13 is formed on an upper surface of a piezoelectric wafer 121. Next, as shown in FIG. 3B, a plurality of metal films are laminated on the upper surface of the piezoelectric wafer 121 so as to form the wiring layer 14. The wiring layer 14 is connected to the IDT electrode 13. The IDT electrode 13 and the wiring layer 14 are formed by a photolithography method or the like. Subsequently, a protective insulation film (not shown) is formed on a surface of the IDT electrode 13 and the wiring layer 14 by sputtering or the like. Then, a cavity is formed in the protective insulation film by dry etching so that the wiring layer 14 and the extended interconnection 18 (see FIG. 4B) can be connected to each other.

Figure 3C:
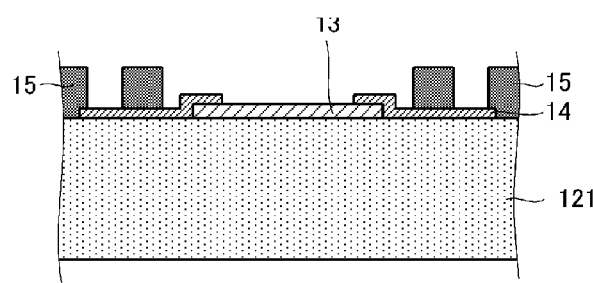

Next, as shown in FIG. 3C, a photosensitive resin is applied on the upper surface of the piezoelectric wafer 121 by a spin coat method. Subsequently, the photosensitive resin is patterned by the photolithography method so that the IDT electrode 13 is exposed and so that a cavity is formed at a portion corresponding to the extended interconnection 18. With this, the support layer 15 is formed.

Figure 3D:
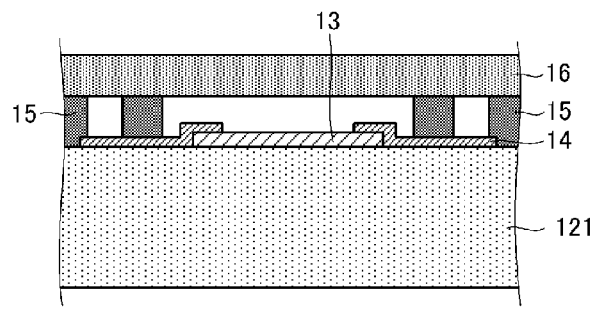
Figure 4A:
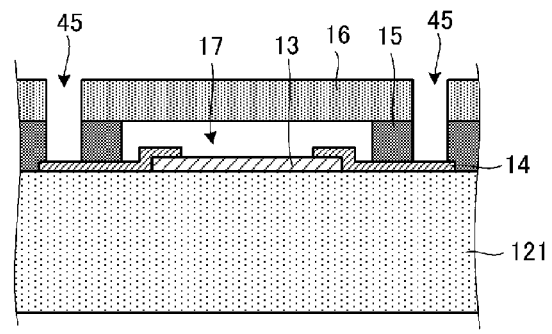
FIGS. 4A-4C are cross-sectional views illustrating a manufacturing method of the elastic wave filter device according to the first preferred embodiment of the present invention.

Next, as shown in FIG. 3D, a photosensitive resin sheet is pasted on an upper surface of the support layer 15 by a roll lamination method or the like. Subsequently, as shown in FIG. 4A, the photosensitive resin sheet is patterned by the photolithography method so that a cavity is formed at a portion corresponding to a cavity of the support layer 15. With this, the cover layer 16 and a via 45 are formed, and the sealed space 17 is formed above the IDT electrode 13.

Figure 4B:
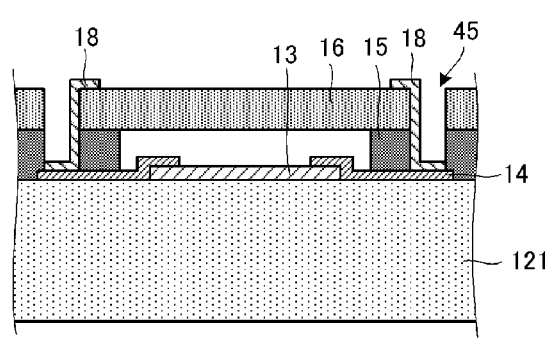

Next, as shown in FIG. 4B, the extended interconnection 18 is formed by electroplating in the via 45. The extended interconnection 18 is connected to wiring layer 14 and extends from the bottom of the via 45 up to the upper surface of the cover layer 16. To be specific, the extended interconnection 18 is formed as follows. That is, a plating power feeding film made of a Cu/Ti film is formed first by sputtering. Next, a resist having an opening at a portion where the extended interconnection 18 is formed, is formed by the photolithography method. Subsequently, an Au/Ni/Cu film is formed by electroplating. Then, the resist is peeled off and the power feeding film is removed by etching, such that the extended interconnection 18 is formed.

Figure 4C:
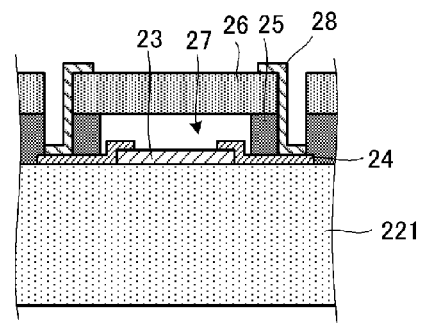

Through the above-described processes, a plurality of structures of the transmission filter chips 11 (see FIG. 1) are formed on the piezoelectric wafer 121. Next, as shown in FIG. 4C, a plurality of structures of the reception filter chips 21 are formed on a piezoelectric wafer 221, like the case of the transmission filter chip 11. In this case, as discussed above, the layout of the IDT electrode 23 and the wiring layer 24 is defined such that the reception filter chip 21 is smaller in dimension than the transmission filter chip 11.

Figure 5A:
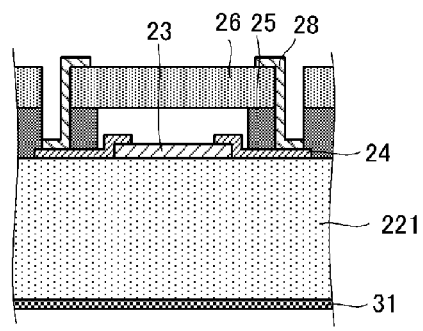
FIGS. 5A-5C are cross-sectional views illustrating a manufacturing method of the elastic wave filter device according to the first preferred embodiment of the present invention.

Next, as shown in FIG. 5A, the adhesive film (die attach film) 31 is pasted on a lower surface of the piezoelectric wafer 221. It is preferable for the elastic modulus of the material of the adhesive film 31 to be lower than that of the material of the cover layer 16 (see FIG. 5C). This prevents the sealed space 17 from being deformed when the reception filter chip 21 is fixed onto the upper surface of the cover layer 16.

Figure 5B:
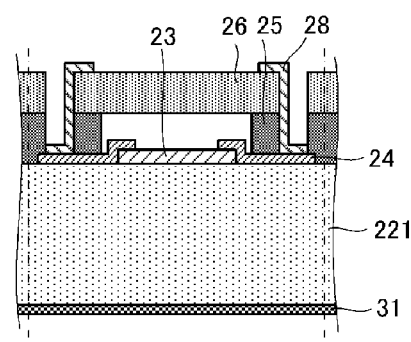
Figure 5C:
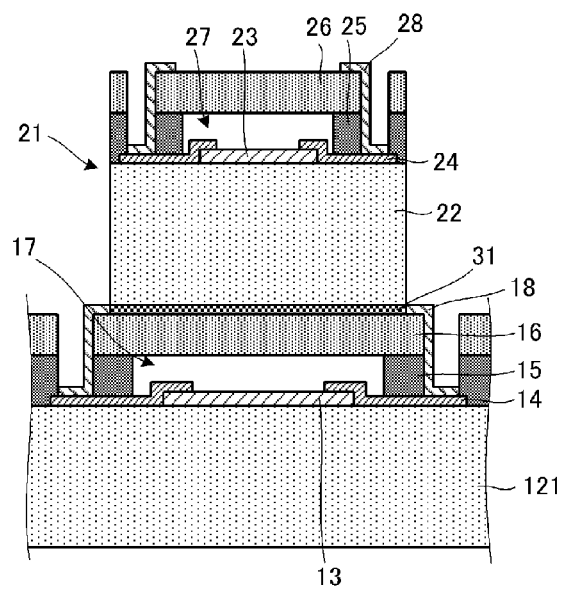

Next, as shown in FIG. 5B, the reception filter chip 21 can be obtained by cutting the piezoelectric wafer 221 with a dicing machine along dot-dash lines. Subsequently, as shown in FIG. 5C, the reception filter chip 21 is fixed onto the upper surface of the cover layer 16 through die bonding and solidification.

Figure 6A:
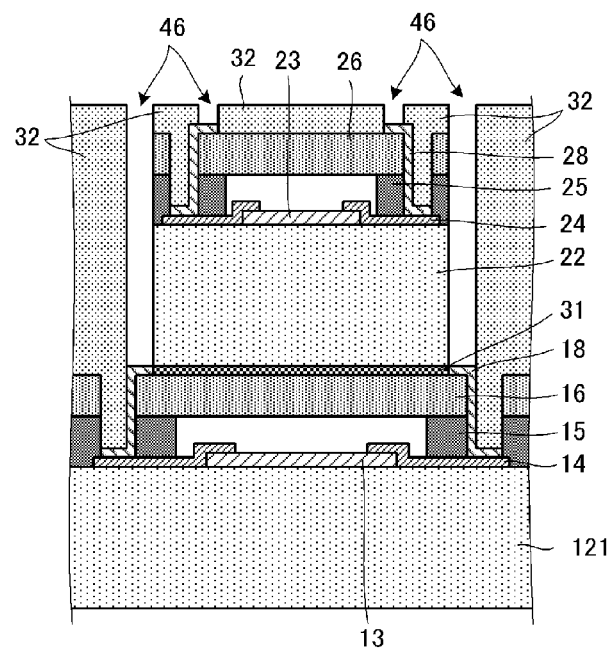
FIGS. 6A and 6B are cross-sectional views illustrating a manufacturing method of the elastic wave filter device according to the first preferred embodiment of the present invention.

Next, as shown in FIG. 6A, a photosensitive resin is applied to the structure formed through the above-described processes. Then, the photosensitive resin is patterned by the photolithography method so that a portion of the extended interconnections 18 and 28 are exposed. Through this, the resin layer 32 and vias 46 are formed.

Figure 6B:
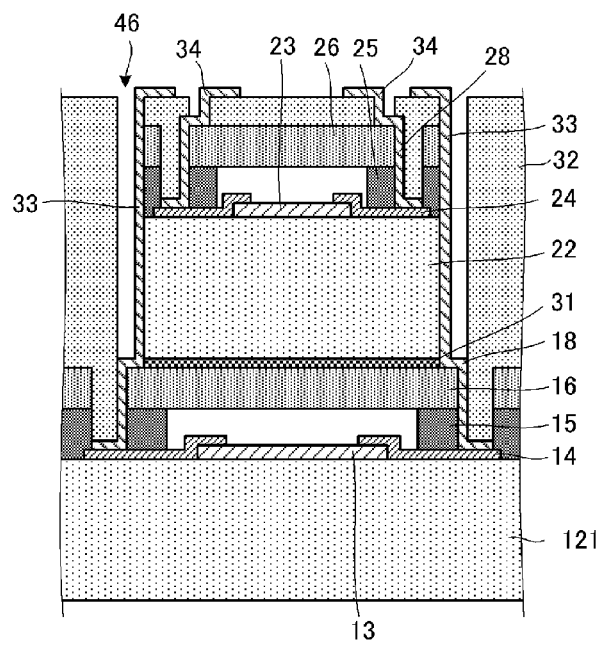

Next, as shown in FIG. 6B, the extended interconnections 33 and 34 are formed in the vias 46 by electroplating. The extended interconnections 33 and 34 each extend from the bottom of the via 46 up to the upper surface of the resin layer 32. The extended interconnection 33 is connected to the extended interconnection 18, while the extended interconnection 34 is connected to the extended interconnection 28. The specific process for forming the extended interconnections 33 and 34 is the same as the case of forming the extended interconnection 18 mentioned above.

Figure 7A:
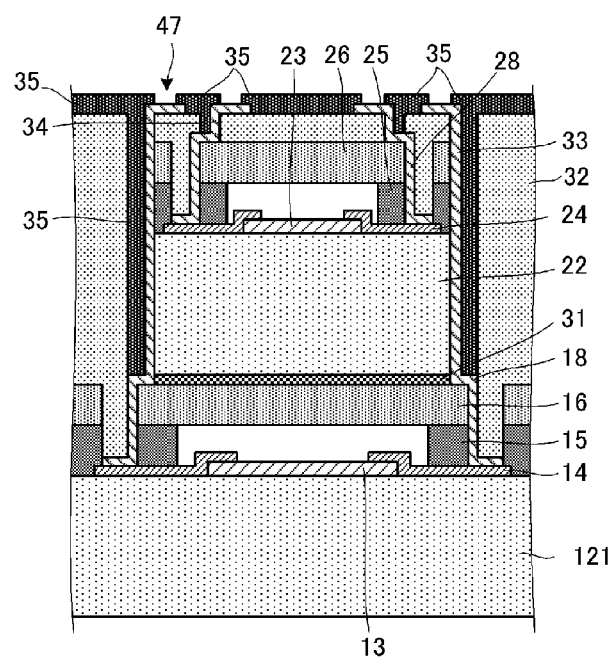
FIGS. 7A and 7B are cross-sectional views illustrating a manufacturing method of the elastic wave filter device according to the first preferred embodiment of the present invention.

Next, as shown in FIG. 7A, the protection resist 35 is formed on the upper surface of the resin layer 32 and in the vias 46 so as to cover the extended interconnections 18, 28, 33, and 34. Then, cavities 47 are formed through patterning the protection resist 35 by the photolithography method so that a portion of the extended interconnections 33 and 34 are exposed.

Figure 7B:
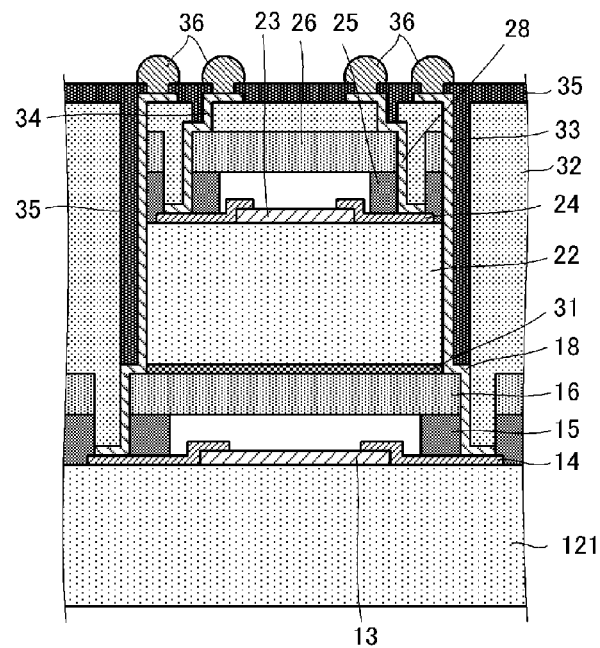
Figure 8:
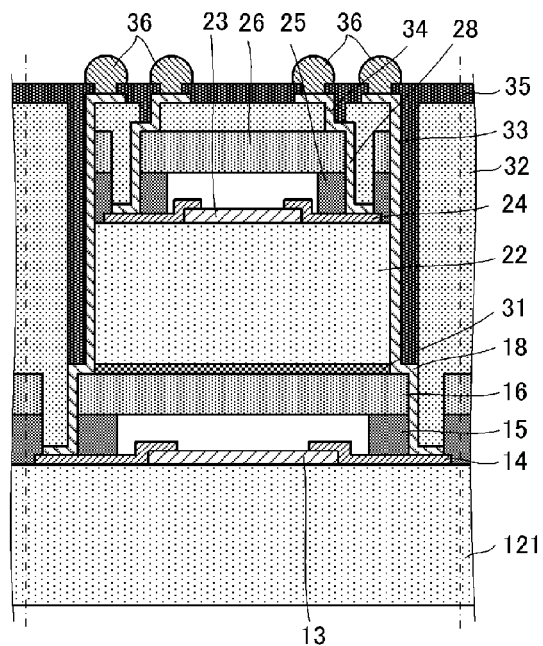
FIG. 8 is a cross-sectional view illustrating a manufacturing method of the elastic wave filter device according to the first preferred embodiment of the present invention.

Next, as shown in FIG. 7B, the mounting terminals 36 are formed by applying a solder paste to the cavities 47 using a metal mask, carrying out reflow heating, and then carrying out flux cleaning. The mounting terminals 36 are connected to the extended interconnections 33 and 34. Next, as shown in FIG. 8, the elastic wave filter device 10 shown in FIG. 1 is completed by cutting the piezoelectric wafer 121 with a dicing machine along dot-dash lines.

Second Preferred Embodiment

Figure 9:
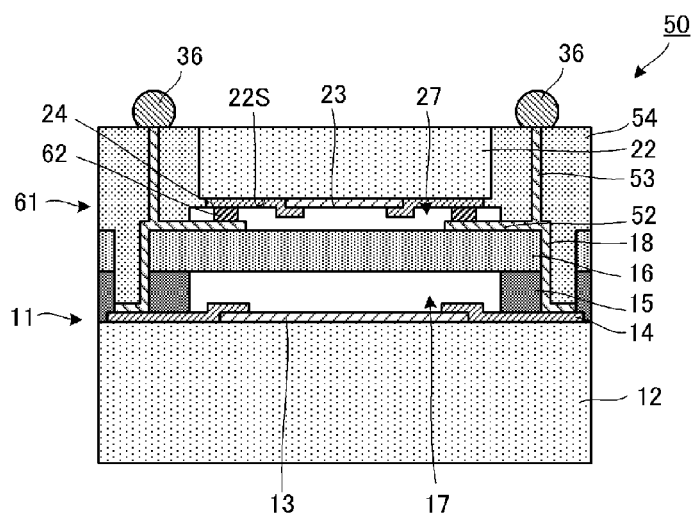
FIG. 9 is a cross-sectional view of an elastic wave filter device according to a second preferred embodiment of the present invention.

An elastic wave filter device 50 according to a second preferred embodiment of the present invention will be described. FIG. 9 is a cross-sectional view of the elastic wave filter device 50. The elastic wave filter device 50 includes the transmission filter chip 11 and a reception filter chip 61. The transmission filter chip 11 is configured in the same manner as the case of the first preferred embodiment. The reception filter chip 61 includes the piezoelectric substrate 22, the IDT electrode 23, and the wiring layer 24. The IDT electrode 23 and the wiring layer 24 are provided on a principal surface 22S of the piezoelectric substrate 22. The wiring layer 24 is connected to the IDT electrode 23. On a surface of the IDT electrode 23 and the wiring layer 24, a protective insulation film (not shown) is formed so as to expose a portion to be in contact with Sn—Ag solder 62. An area of the principal surface 22S of the piezoelectric substrate 22 is smaller than the area of the principal surface (upper surface) of the piezoelectric substrate 12.

An extended interconnection 52 is provided on the upper surface of the cover layer 11 of the transmission filter chip 11. The reception filter chip 61 is disposed on the cover layer 16 of the transmission filter chip 11. The principal surface 22S of the piezoelectric substrate 22 of the reception filter chip 61 opposes the upper surface of the cover layer 16 of the transmission filter chip 11. The wiring layer 24 of the reception filter chip 61 is connected to the extended interconnection 52 with the solder 62.

A column-shaped extended interconnection 53 is provided on the upper surface of the cover layer 16 of the transmission filter chip 11. A thickness (height) of the extended interconnection 53 preferably is, for example, approximately 100 μm. The extended interconnections 18 and 52 are connected to the extended interconnection 53. The extended interconnections 18, 52, and 53 are wired in an inner side portion of the transmission filter chip 11 when viewed in the lamination direction. The extended interconnections 18 and 53 are wired so as to pass an outer side portion of the reception filter chip 61.

A resin layer (sealing resin) 54 preferably covers the extended interconnections 18, 52, and 53 and surrounds the ID electrode 23 of the reception filter chip 61. With this structure, the sealed space 27 is provided between the piezoelectric substrate 22 of the reception filter chip 61 and the cover layer 16 of the transmission filter chip 11. That is, the sealed space 27 is secured above the IDT electrode 23 (at the side opposite to the piezoelectric substrate 22 side). The mounting terminals 36 are provided on an upper surface of the resin layer 54. The mounting terminals 36 are each connected to an upper end portion of the extended interconnection 53 exposed from the resin layer 54. As discussed above, the mounting terminals 36 are disposed on a side of the reception filter chip 61 opposite to the transmission filter chip 11 side.

Other constituent elements of the elastic wave filter device 50 are the same as those according to the first preferred embodiment.

As in the case of the first preferred embodiment, the elastic wave filter device 50 is mounted such that the reception filter chip 61 side faces the mounting surface of the module substrate. The mounting terminals 36 make contact with the mounting pads provided on the mounting surface of the module substrate and are electrically connected thereto. As such, a wiring length between the reception filter chip 61 and the ground line of the module substrate becomes short, thus making it possible to realize a preferable isolation characteristic.

As mentioned above, the transmission filter chip 11 is larger in dimension than the reception filter chip 61. With this, like the first preferred embodiment, the material amount of the piezoelectric substrate used in the reception filter chip 61 is significantly reduced while ensuring the electric power handling capability of the transmission filter chip 11.

Further, as discussed above, the extended interconnections 18, 52, and 53 are wired in the inner side portion of the transmission filter chip 11 when viewed in the lamination direction. Because of this, like the first preferred embodiment, the elastic wave filter device 10 is significantly reduced in size or miniaturized.

Figure 10A:
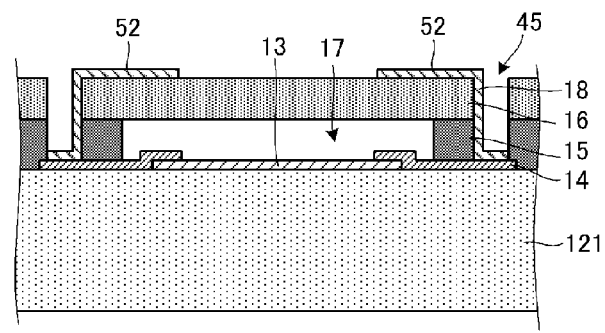
FIGS. 10A-10C are cross-sectional views illustrating a manufacturing method of the elastic wave filter device according to the second preferred embodiment of the present invention.
Figure 10B:
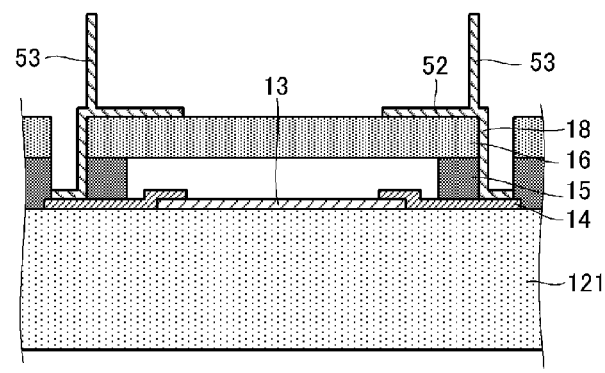

FIG. 10A through FIG. 13 are cross-sectional views illustrating a non-limiting example of a manufacturing method of the elastic wave filter device 50. First, as shown in FIG. 10A, a plurality of structures of the transmission filter chips 11 (see FIG. 9) are formed on the piezoelectric wafer 121 in the same process as that of the first preferred embodiment. The extended interconnection 52 is formed by electroplating along with the extended interconnection 18. Next, as shown in FIG. 10B, the column-shaped extended interconnection (Cu post) 53 is formed on the upper surface of the cover layer 16. The process of forming the extended interconnection 53 is the same as the process of forming the extended interconnection 18.

Figure 10C:
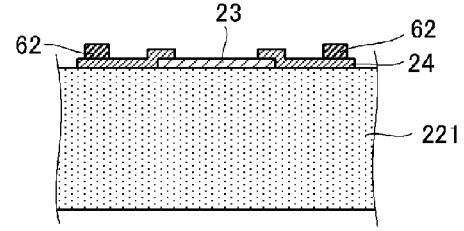
Figure 11A:
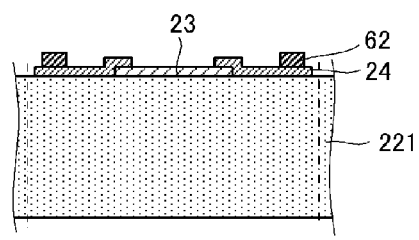
FIGS. 11A and 11B are cross-sectional views illustrating a manufacturing method of the elastic wave filter device according to the second preferred embodiment of the present invention.

Next, through the same process as that of the first preferred embodiment, the IDT electrode 23 and the wiring layer 24 are formed on the upper surface of the piezoelectric wafer 221, and then a protective insulation film (not shown) is formed on the surface of the IDT electrode 23 and the wiring layer 24, as shown in FIG. 10C. Subsequently, the Sn—Ag solder 62 is formed on the upper surface of the wiring layer 24 by solder plating. Then, as shown in FIG. 11A, the reception filter chip 61 can be obtained by cutting the piezoelectric wafer 221 with a dicing machine along dot-dash lines.

Figure 11B:
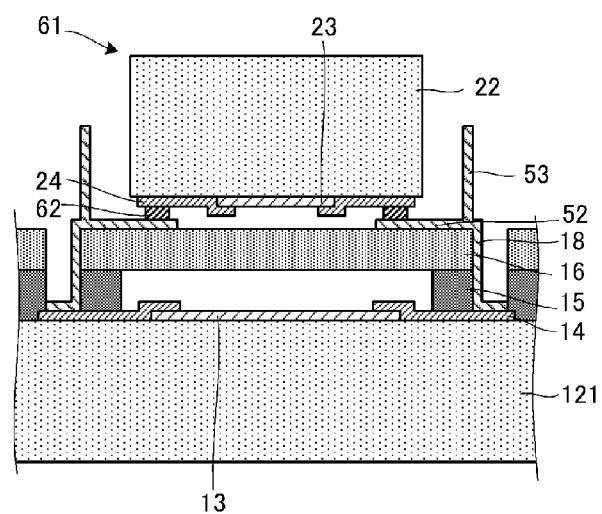
Figure 12A:
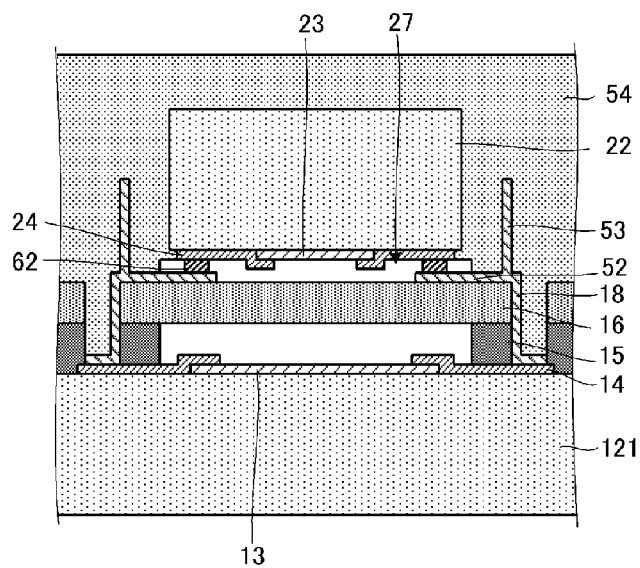
FIGS. 12A and 12B are cross-sectional views illustrating a manufacturing method of the elastic wave filter device according to the second preferred embodiment of the present invention.
Figure 12B:
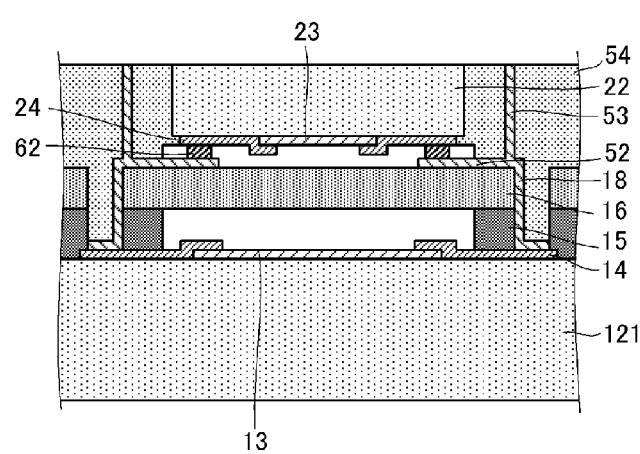

Next, as shown in FIG. 11B, the reception filter chip 61 is mounted on the upper surface of the cover layer 16. The wiring layer 24 is connected to the extended interconnection 52 through the solder 62. Subsequently, as shown in FIG. 12A, the resin layer 54 is formed surrounding the IDT electrode 23. Through this, the sealed space 27 is formed between the piezoelectric substrate 22 and the cover layer 16. Then, as shown in FIG. 12B, the upper end portion of the extended interconnection 53 is exposed to the upper surface of the resin layer 54 by polishing the resin layer 54 and the piezoelectric substrate 22 from the upper side. Note that the piezoelectric wafer 121 may be polished from the lower side. With this, the height of the elastic wave filter device 50 is significantly reduced.

Figure 13:
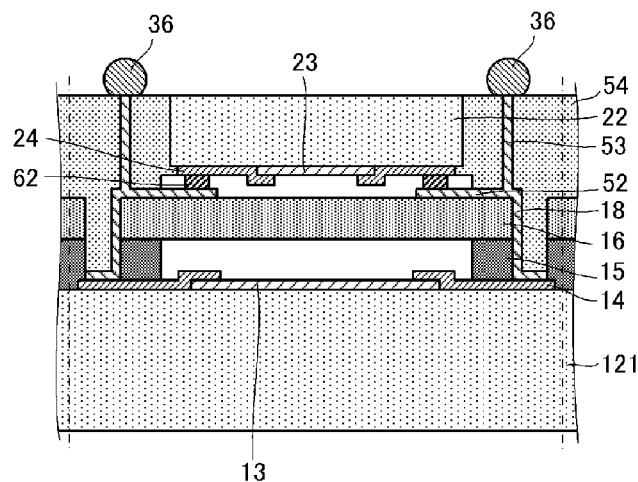
FIG. 13 is a cross-sectional view illustrating a manufacturing method of the elastic wave filter device according to the second preferred embodiment of the present invention.

Next, as shown in FIG. 13, the mounting terminals 36 are formed on the upper surface of the resin layer 54 in the same process as that of the first preferred embodiment. The mounting terminals 36 are each connected to the extended interconnection 53. Then, by cutting the piezoelectric wafer 121 with a dicing machine along dot-dash lines, the elastic wave filter device 50 shown in FIG. 9 is completed.

Third Preferred Embodiment

Figure 14:
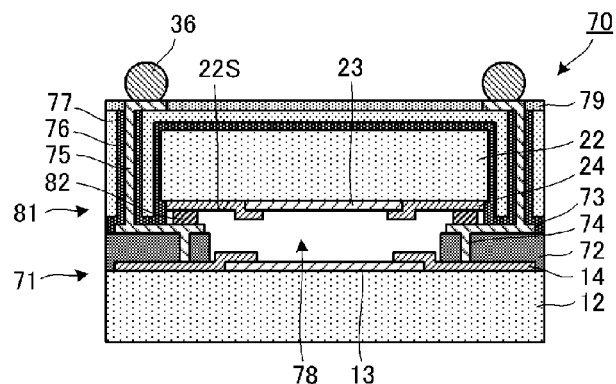
FIG. 14 is a cross-sectional view of an elastic wave filter device according to a third preferred embodiment of the present invention.

An elastic wave filter device 70 according to a third preferred embodiment of the present invention will be described. FIG. 14 is a cross-sectional view of the elastic wave filter device 70. The elastic wave filter device 70 includes a transmission filter chip 71 and a reception filter chip 81.

The transmission filter chip 71 includes the piezoelectric substrate 12, the IDT electrode 13, and the wiring layer 14. The IDT electrode 13 and the wiring layer 14 are formed on the upper surface of the piezoelectric substrate 12. The wiring layer 14 is connected to the IDT electrode 13. A protective insulation film (not shown) is formed on the surface of the IDT electrode 13 and the wiring layer 14 so as to expose a portion that makes contact with an extended interconnection 74. The reception filter chip 81 is formed in the same manner as the reception filter chip 61 according to the second preferred embodiment. The area of the principal surface 22S of the piezoelectric substrate 22 is smaller than the area of the principal surface (upper surface) of the piezoelectric substrate 12.

A resin layer 72 is formed on the upper surface of the piezoelectric substrate 12 of the transmission filter chip 71 so as to surround the IDT electrode 13 of the transmission filter chip 71. An extended interconnection 73 is formed on an upper surface of the resin layer 72. The extended interconnection 74 is formed so as to pass through the resin layer 72 in the lamination direction (up-down direction). The extended interconnection 74 is connected to the extended interconnection 73 and the wiring layer 14 of the transmission filter chip 71.

The reception filter chip 81 is disposed on the transmission filter chip 71. The principal surface 22S of piezoelectric substrate 22 of the reception filter chip 81 opposes the upper surface of the piezoelectric substrate 12 of the transmission filter chip 71. The wiring layer 24 of the reception filter chip 81 is connected to the extended interconnection 73 with solder 82.

A column-shaped extended interconnection 75 is formed on the upper surface of resin layer 72. The extended interconnection 75 is connected to the extended interconnection 73. The extended interconnections 73 through 75 are wired in an inner side portion of the transmission filter chip 11 when viewed in the lamination direction. The extended interconnections 73 through 75 are wired so as to pass an outer side portion of the reception filter chip 21.

A resin layer (sealing resin) 76 is formed so as to cover the reception filter chip 81 as well as the extended interconnections 73 and 75. A resin layer (sealing resin) 77 is formed on an upper surface of the resin layer 76. With this, a sealed space 78 is formed between the upper surface of the piezoelectric substrate 12 of the transmission filter chip 71 and the principal surface 22S of the piezoelectric substrate 22 of the reception filter chip 81. That is, the sealed space 78 is secured above the IDT electrode 13 and above the IDT electrode 23 (at the side opposite to the piezoelectric substrate 22 side).

A protection resist 79 is formed on an upper surface of the resin layer 77. An upper end portion of the extended interconnection 75 is exposed from the protection resist 79. The mounting terminals 36 are formed on the upper end portion of the extended interconnection 75. The mounting terminals 36 are each connected to the extended interconnection 75. As described above, the mounting terminals 36 are disposed on a side of the reception filter chip 81 opposite to the transmission filter chip 71 side.

Other constituent elements of the elastic wave filter device 70 are the same as those according to the first preferred embodiment. The elastic wave filter device 70 is mounted such that the reception filter chip 81 side faces the mounting surface of the module substrate like the case of the first preferred embodiment. The mounting terminals 36 make contact with the mounting pads on the mounting surface of the module substrate and are electrically connected thereto.

The third preferred embodiment achieve the same effects as the second preferred embodiment.

Figure 15:
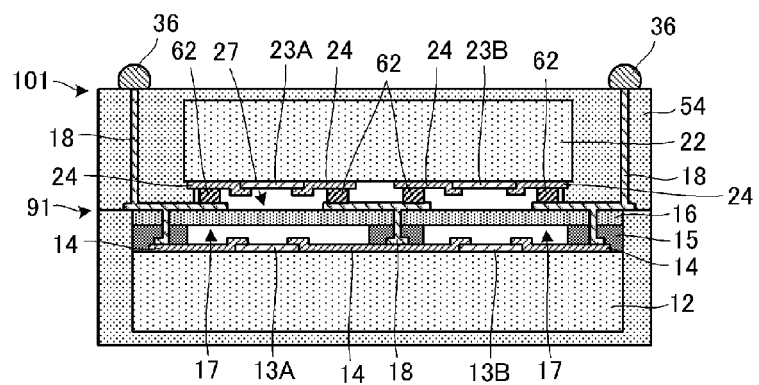
FIG. 15 is a cross-sectional view of an elastic wave filter device according to another preferred embodiment of the present invention.

In the first through third preferred embodiments, the elastic wave filter device preferably include a transmission filter corresponding to a plurality of transmission bands and/or a reception filter corresponding to a plurality of reception bands. FIG. 15 illustrates, as an example, a configuration in which a filter corresponding to a plurality of bands is included in the structure according to the second preferred embodiment. The same can be applied to the first and third preferred embodiments as well.

In the configuration shown in FIG. 15, a transmission filter chip 91 preferably includes a transmission filter corresponding to two transmission bands, and a reception filter chip 101 includes a reception filter corresponding to two reception bands. IDT electrodes 13A and 13B of the transmission filter chip 91 each correspond to a predetermined transmission band, and IDT electrodes 23A and 23B of the reception filter chip 101 each correspond to a predetermined reception band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device to be mounted on a mounting surface of a module, the elastic wave filter device comprising:
   a transmission filter chip including a first piezoelectric substrate, a first functional electrode provided on a principal surface of the first piezoelectric substrate, and a first extended interconnection connected to the first functional electrode;
   a reception filter chip including a second piezoelectric substrate, a second functional electrode provided on a principal surface of the second piezoelectric substrate, and a second extended interconnection connected to the second functional electrode, the reception filter chip being laminated on or above the transmission filter chip;
   a first mounting terminal that is a mounting terminal of the transmission filter chip and is connected to the first extended interconnection;
   a second mounting terminal that is a mounting terminal of the reception filter chip and is connected to the second extended interconnection; and
   a protection film that protects at least the first extended interconnection and the second extended interconnection and is provided between the mounting surface and the reception filter chip in a lamination direction; wherein
   the first mounting terminal and the second mounting terminal are provided between the mounting surface and the protection film in the lamination direction.

2. The elastic wave filter device according to claim 1, wherein an area of the reception filter chip is smaller than an area of the transmission filter chip when viewed in the lamination direction.

3. The elastic wave filter device according to claim 2, wherein
   the first extended interconnection is wired in an outer side portion of the reception filter chip, is also wired in an inner side portion of the transmission filter chip when viewed in the lamination direction.

4. The elastic wave filter device according to claim 1, wherein
   the transmission filter chip includes a transmission filter corresponding to a plurality of transmission bands; and
   the reception filter chip includes a reception filter corresponding to a plurality of reception bands.

5. The elastic wave filter device according to claim 1, wherein the first functional electrode is an interdigital transducer and the second functional electrode is an interdigital transducer.

6. The elastic wave filter device according to claim 1, further comprising a resin layer that covers an upper surface of the transmission filter chip and an upper surface of the reception filter chip.

7. The elastic wave filter device according to claim 6, wherein the reception filter chip includes vias provided in the resin layer and the second extended interconnection is provided in the vias.

8. The elastic wave filter device according to claim 7, wherein the protection film is provided on an upper surface of the resin layer and in the vias.

9. The elastic wave filter device according to claim 8, wherein the protection film includes cavities that include the first and second mounting terminals projecting therefrom.

10. The elastic wave filter device according to claim 1, wherein at least one of the first functional electrode of the transmission filter chip and the second functional electrode of the reception filter chip uses at least one of surface acoustic waves, boundary acoustic waves, and plate waves.

11. The elastic wave filter device according to claim 1, further comprising:
a cover layer covering the second functional electrode to provide a space above the second functional electrode; wherein
the second extended interconnection is provided on an upper surface of the cover layer.

12. The elastic wave filter device according to claim 11, further comprising a resin layer that covers the upper surface of the cover layer and an upper surface of the transmission filter chip.

13. A duplexer comprising the elastic wave filter device according to claim 1.

14. The elastic wave filter device according to claim 1, wherein the first mounting terminal is provided at an outer side portion of the second mounting terminal when viewed in the lamination direction.

15. The elastic wave filter device according to claim 14, wherein an area of the reception filter chip is smaller than an area of the transmission filter chip when viewed in the lamination direction.

16. The elastic wave filter device according to claim 15, wherein the first extended interconnection is wired in an outer side portion of the reception filter chip and is wired in an inner side portion of the transmission filter chip when viewed in the lamination direction.

* * * * *